(12) United States Patent
Stolk et al.

(10) Patent No.: US 8,982,319 B2
(45) Date of Patent: Mar. 17, 2015

(54) LITHOGRAPHIC APPARATUS AND METHOD

(75) Inventors: Roland Pieter Stolk, Sprang-Capelle (NL); Paul Van Der Veen, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 514 days.

(21) Appl. No.: 13/045,090

(22) Filed: Mar. 10, 2011

(65) Prior Publication Data

US 2011/0222029 A1  Sep. 15, 2011

Related U.S. Application Data

(60) Provisional application No. 61/313,275, filed on Mar. 12, 2010, provisional application No. 61/332,033, filed on May 6, 2010.

(51) Int. Cl.

| | |
|---|---|
| *G03B 27/68* | (2006.01) |
| *G03F 7/20* | (2006.01) |
| *G03B 27/42* | (2006.01) |
| *G03B 27/52* | (2006.01) |
| *G03B 27/54* | (2006.01) |
| *G03B 27/72* | (2006.01) |
| *G03B 27/32* | (2006.01) |

(52) U.S. Cl.
CPC .................................... *G03F 7/7085* (2013.01)
USPC ................... 355/52; 355/53; 355/55; 355/67; 355/71; 355/77

(58) Field of Classification Search
USPC ........... 355/52, 53, 55, 67–71, 77; 250/336.1, 250/492.1, 492.2, 492.22, 548; 356/338, 356/364, 491
See application file for complete search history.

(56) References Cited

U.S. PATENT DOCUMENTS

| | | | |
|---|---|---|---|
| 4,964,707 A * | 10/1990 | Hayashi ........................ 359/371 |
| 5,719,845 A | 2/1998 | Ando |
| 5,774,215 A * | 6/1998 | Padgett et al. ................ 356/453 |
| 5,867,315 A * | 2/1999 | Koike et al. ............... 359/489.09 |
| 6,768,546 B2 | 7/2004 | Sato |
| 6,963,448 B1 * | 11/2005 | Hayakawa ............... 359/489.12 |
| 7,075,616 B2 | 7/2006 | Derksen et al. |
| 7,352,434 B2 | 4/2008 | Streefkerk et al. |
| 7,684,008 B2 | 3/2010 | De Smit et al. |
| 2001/0032940 A1 * | 10/2001 | Iwatsuka ....................... 250/551 |
| 2003/0038937 A1 | 2/2003 | Sato |

(Continued)

FOREIGN PATENT DOCUMENTS

| | | |
|---|---|---|
| CN | 1550905 | 12/2004 |
| CN | 1637608 | 7/2005 |

(Continued)

OTHER PUBLICATIONS

English translation of JP2001-035782, published on Feb. 9, 2011.*

(Continued)

*Primary Examiner* — Christina Riddle
(74) *Attorney, Agent, or Firm* — Pillsbury Winthrop Shaw Pittman LLP

(57) ABSTRACT

A detector to measure a property of radiation is disclosed. The detector comprises first and second luminescent uniaxial crystals each having an optic axis, the optic axis of the first uniaxial crystal being arranged such that it is substantially perpendicular to the optic axis of the second uniaxial crystal.

20 Claims, 4 Drawing Sheets

(56) References Cited

U.S. PATENT DOCUMENTS

| | | |
|---|---|---|
| 2004/0021942 A1* | 2/2004 | Yamamoto et al. ........... 359/494 |
| 2004/0211920 A1 | 10/2004 | Derksen et al. |
| 2005/0007569 A1 | 1/2005 | Streefkerk et al. |
| 2005/0024609 A1 | 2/2005 | De Smit et al. |
| 2005/0146704 A1* | 7/2005 | Gruner et al. ................... 355/71 |
| 2006/0055909 A1* | 3/2006 | Fiolka et al. .................... 355/71 |
| 2006/0192937 A1* | 8/2006 | Kerkhof et al. ................. 355/71 |
| 2007/0030551 A1* | 2/2007 | Oka et al. ....................... 359/237 |
| 2008/0174759 A1* | 7/2008 | Schuster ........................ 355/71 |

FOREIGN PATENT DOCUMENTS

| | | |
|---|---|---|
| JP | 2001-035782 | 2/2001 |
| JP | 2002-36373 | 2/2002 |
| JP | 2003-324028 | 11/2003 |
| JP | 2008-177581 | 7/2008 |
| KR | 10-1999-0083636 | 11/1999 |
| TW | 200611063 | 4/2006 |

OTHER PUBLICATIONS

Chinese Office Action dated Nov. 28, 2012 in corresponding Chinese Patent Application No. 201110065429.5.

Chinese Office Action dated May 29, 2013 in corresponding Chinese Patent Application No. 201110065429.5.

Taiwan Office Action dated Aug. 15, 2013 in corresponding Taiwan Patent Application No. 100107601.

* cited by examiner

US 8,982,319 B2

LITHOGRAPHIC APPARATUS AND METHOD

This application claims priority and benefit under 35 U.S.C. §119(e) to U.S. Provisional Patent Application Ser. No. 61/313,275, entitled "Lithographic Apparatus and Method", filed on Mar. 12, 2010, and to U.S. Provisional Patent Application Ser. No. 61/332,033, entitled "Lithographic Apparatus and Method", filed on May 6, 2010. The contents of those applications are incorporated herein in their entirety by reference.

FIELD

The present invention relates to a lithographic apparatus, a device manufacturing method and a detector.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

A lithographic apparatus usually uses a radiation beam to project the pattern from the patterning device onto the substrate. Properties of the radiation beam may be controlled by the lithographic apparatus. The properties may be adjusted, for example depending upon the type of pattern to be projected onto the substrate. A lithographic apparatus may modify the polarization of the radiation beam. A lithographic apparatus may comprise various detectors to measure properties of the radiation beam. For example, a lithographic apparatus may have a detector used to measure the intensity of the radiation beam.

SUMMARY

A detector to measure a property (e.g., the intensity) of the radiation beam may comprise luminescent crystals, the luminescence of which can be measured using a photodiode or any other suitable intensity sensor.

As mentioned above, the polarization of the radiation beam (and hence radiation incident on the detector) can be changed, depending on the type of pattern to be projected onto the substrate. This change in polarization of radiation incident on the detector can cause the absorption, and therefore also the luminescence efficiency, of the luminescent crystals to be altered. This change in luminescence efficiency may not be instantaneous, but may instead include some delay. In the case where there is a delay in the change of the luminescence efficiency, the response of the detector may have a polarization dependent variation which includes static and/or transient components. The transient component of the response variation of the detector may reduce the signal stability of the detector, and this may in turn reduce the imaging performance of the lithographic apparatus. Due to the static component of the response variation, the detector may be sensitive to unintentional drifts in the polarization of the incident radiation. This may introduce an error into the property (e.g., intensity) measured by the detector.

It is desirable to provide, for example, a lithographic apparatus which comprises a detector which obviates or mitigates one or more of the problems of the art, whether identified herein or elsewhere.

According to an aspect, there is provided a lithographic apparatus comprising: a substrate table to hold a substrate; a projection system to project a patterned radiation beam onto a target portion of the substrate; and a detector configured to measure a property of the radiation, the detector comprising first and second luminescent uniaxial crystals each having an optic axis, the optic axis of the second uniaxial crystal being arranged such that it is substantially perpendicular to the optic axis of the first uniaxial crystal.

According to an aspect, there is provided A device manufacturing method, comprising: projecting a patterned radiation beam onto a target portion of a substrate; and using a detector to measure a property of the radiation, the detector comprising first and second luminescent uniaxial crystals each having an optic axis, the optic axis of the second uniaxial crystal being arranged such that it is substantially perpendicular to the optic axis of the first uniaxial crystal.

According to an aspect, there is provided a detector configured to measure a property of a beam of radiation, the detector comprising first and second luminescent uniaxial crystals each having an optic axis, the optic axis of the second uniaxial crystal being arranged such that it is substantially perpendicular to the optic axis of the first uniaxial crystal.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
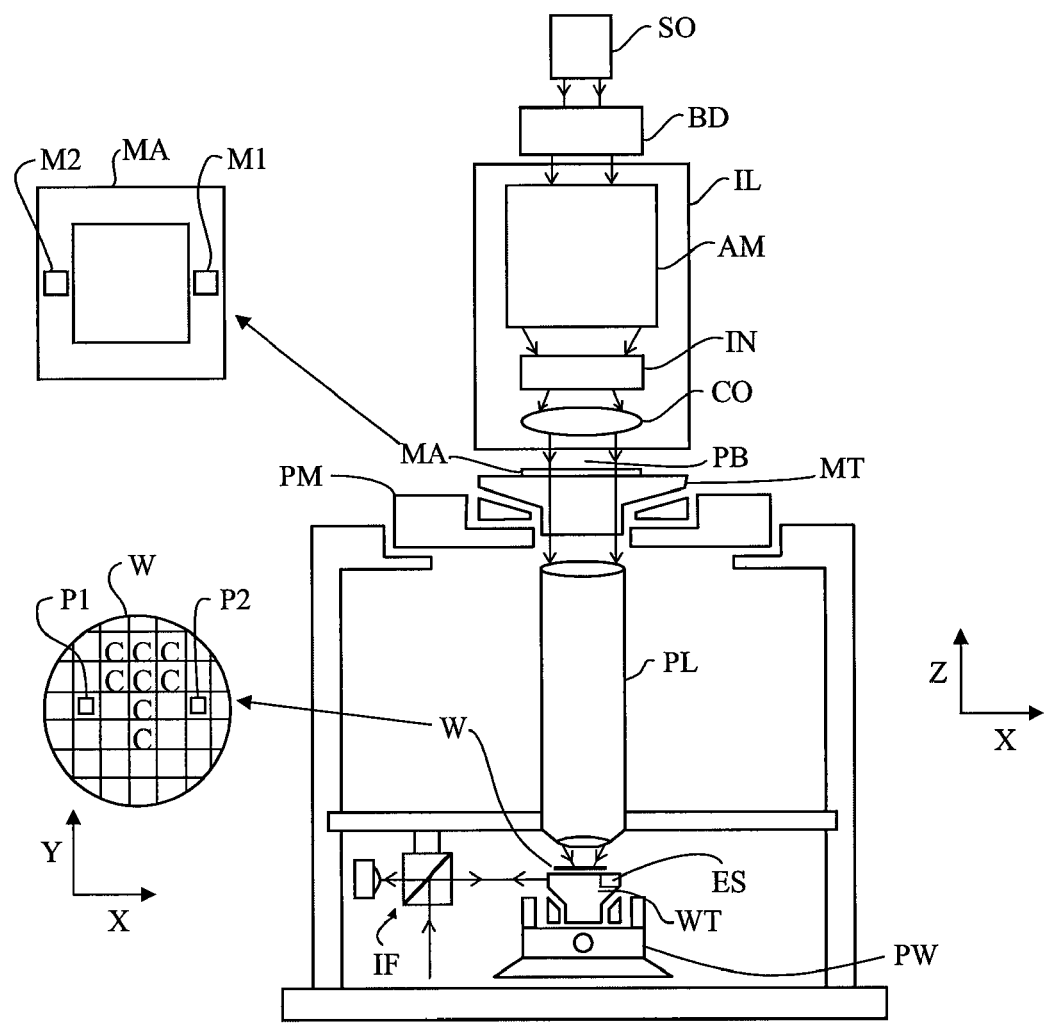
FIG. 1 schematically shows a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A patterning device support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system discussed herein may encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more patterning device support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

- an illumination system (illuminator) IL to condition a beam PB of radiation (e.g. UV radiation or deep ultra-violet (DUV) radiation).
- a support structure (e.g. a mask table) MT to support a patterning device (e.g. a mask) MA and connected to first positioning device PM to accurately position the patterning device with respect to item PL;
- a substrate table (e.g. a wafer table) WT to hold a substrate (e.g. a resist coated wafer) W and connected to second positioning device PW to accurately position the substrate with respect to item PL; and
- a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjuster AM to adjust the angular intensity distribution of the beam. Generally, at least the outer and/or inner radial extent (commonly referred to as □-outer and □-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus further comprises a detector ES, such as an intensity detector which is used to measure the intensity of the radiation beam PB.

Detectors may comprise luminescent crystals, the luminescence of which can be measured using a photodiode or any other suitable intensity sensor.

The luminescent crystals may be crystals which exhibit a birefringent property, i.e. having different optical properties for different polarizations of radiation. The birefringent nature of the crystals means that as radiation travels through them components of the radiation with different polarizations may become out of phase with one another, and selective absorption of components of the radiation with different polarizations may occur.

One type of crystal which exhibits a birefringent property is a uniaxial crystal. A uniaxial crystal generally has a tetragonal, hexagonal or trigonal structure and has a single optic axis about which the atoms of the uniaxial crystal are arranged symmetrically. Radiation traveling through a uniaxial crystal parallel to its optic axis will experience a symmetric structure and will hence behave in an isotropic manner. However, radiation traveling through a uniaxial crystal in a direction which is not parallel to the optic axis will encounter an asymmetric structure and will hence behave in an anisotropic manner and experience birefringence.

An example of a luminescent uniaxial crystal is an a-cut luminescent crystal (e.g., an a-cut sapphire crystal). In an a-cut crystal the optic axis (OA) of the crystal is in same plane as the E-field vector of incident radiation. In other words, if the a-cut crystal is configured for incident radiation to be incident perpendicular to its surface, the optic axis of the a-cut crystal will be parallel to its surface.

A property of the radiation beam PB may be controlled by the lithographic apparatus. A property may be adjusted, for example, depending upon the type of pattern to be projected onto the substrate. One such property of the radiation beam PB which can be adjusted is the polarization of the radiation beam. In some known lithographic apparatus the polarization of the radiation beam PB can be changed between two states which are perpendicular to one another. When such a change in polarization occurs in radiation incident on a detector using a luminescent crystal, the luminescence efficiency of the luminescent crystal may change. This change in luminescence efficiency may not be instantaneous, but may instead include some delay. In the case where there is a delay in the change of the luminescence efficiency, the response of the detector may have a polarization dependent variation which includes static and/or transient components. The transient component of the response variation of the detector may reduce the signal stability of the detector, and this may in turn reduce the imaging performance of the lithographic apparatus. Due to the static component of the response variation, the detector may be sensitive to unintentional drifts in the polarization of the incident radiation. This may introduce an error into the property (e.g., intensity) measured by the detector.

Figure 2:
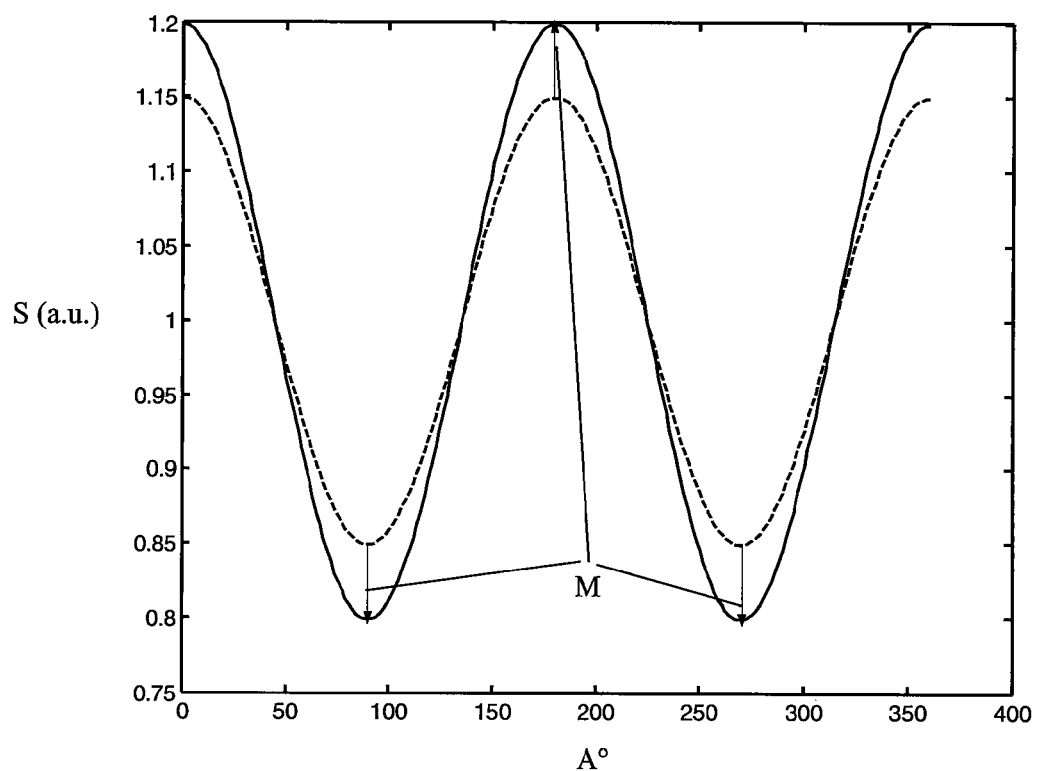
FIG. 2 is a plot showing a typical response variation of a prior art detector.

FIG. 2 shows a typical detector response variation of a known detector as a function of angle between the E-field vector of incident radiation and the OA of the crystal, using a sapphire crystal and DUV radiation with a wavelength of about 193 nm. The angle A° is shown on the horizontal axis, and the detector response S is shown on the vertical axis. It can be seen that the response variation is periodic. FIG. 2 also shows the relative detector response before transient saturation (dashed line) and after transient saturation (solid line).

FIG. 2 shows that static signal variation resulting from a phase shift of 90 degrees can be as large as approximately 40% of the average signal. A phase shift of 90 degrees is equivalent to the polarization state switching from linear x-polarized incident radiation to linear y-polarized incident radiation. FIG. 2 also shows that the magnitude of the signal variation (relative to the average detector response) is greater after transient saturation as opposed to before transient saturation. FIG. 2 further shows that the difference in detector response due to a transient effect (indicated by arrows M) scales with the static response variation. The greater the difference between the detector response at a given angle and the average detector response, the greater the difference between the response of the detector at that angle before transient saturation and after transient saturation.

Figure 3:
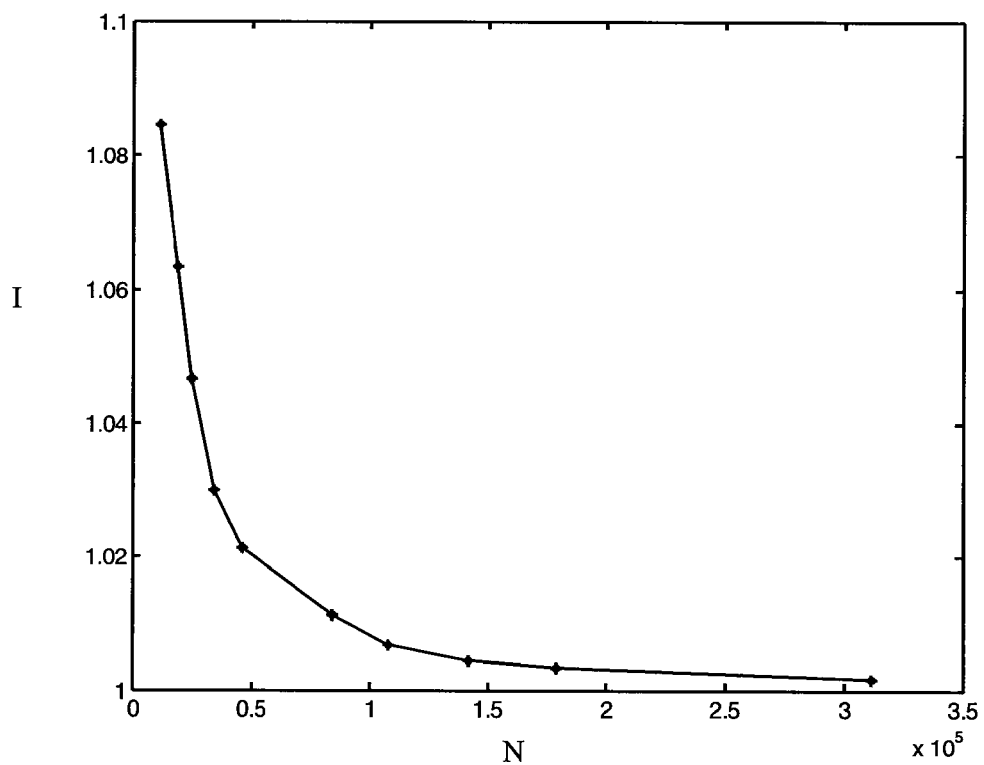
FIG. 3 is a plot showing a typical transient curve of the response of a prior art detector.

FIG. 3 shows a typical transient curve of the response of a known detector comprising a sapphire crystal and using DUV radiation with wavelength of about 193 nm, when changing from a first polarization state of incident radiation to a second polarization state of incident radiation which has a 90 degree phase difference from the first polarization state. The number of pulses N is shown on the horizontal axis, and the relative intensity I as detected by the detector is shown on the vertical axis. For example, the change in polarization states may be between linear x-polarized incident radiation and linear y-polarized incident radiation and vice-versa. The shown transient is a downward curve, the response of the detector decreasing with further exposure to the second polarization state. It will be appreciated that (depending on what the first and second polarization states are) the transient may be an upward curve instead of a downward curve.

FIG. 3 shows that the transient saturation time (i.e. the time it takes for the detector response to reach a steady state after the change in polarization states) is considerable, requiring in excess of about 10000 DUV pulses. In the case of the transient shown in FIG. 3, each pulse has a length of 150 ns and the pulse rate is 6 kHz. At this pulse rate, 10000 pulses is equivalent to a time of about 1.7 seconds. It is common for a lithographic apparatus to be operated in a manner such that there is insufficient time for the transient effect to dissipate (e.g. projection of a pattern onto a substrate continues immediately after a change of polarization state). In this case, while the transient effect dissipates, the output of the detector may be inaccurate or may have a systematic deviation. These inaccuracies or deviations may be sufficiently large that operation of the lithographic apparatus to a desired accuracy is not possible. In an alternative approach, a lithographic apparatus may be operated such that the transient effect is given time to dissipate before a measurement is made. However, the time required for the transient effect to dissipate may be a time limiting step of the operation of the lithographic apparatus, thereby reducing the throughput of the lithographic apparatus.

Figure 4:
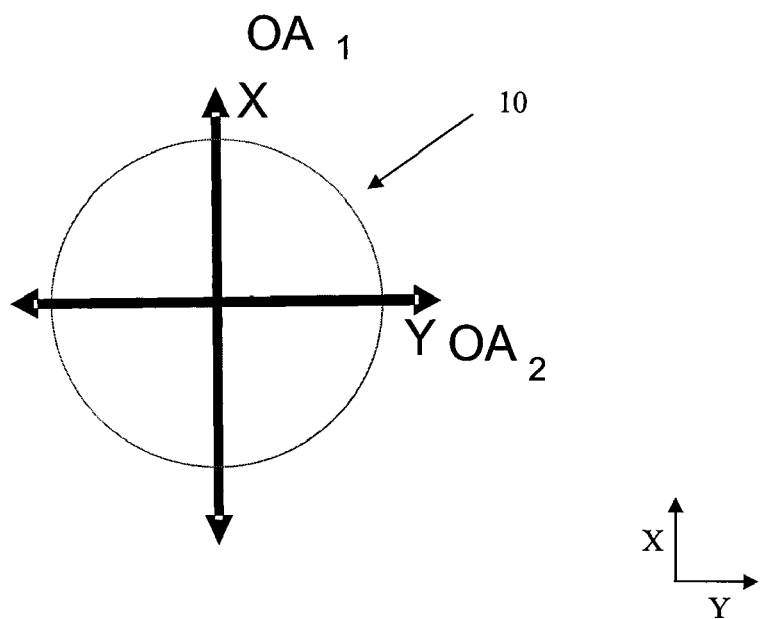
FIG. 4 shows a schematic end elevation of a crystal arrangement which forms part of a detector in accordance with an embodiment of the present invention.
Figure 5:
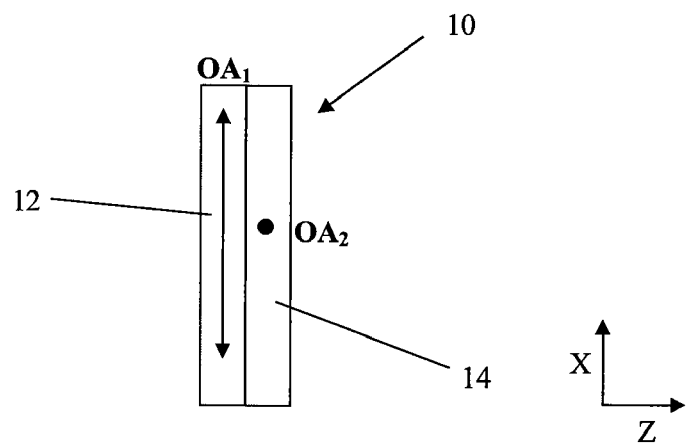
FIG. 5 shows a schematic side elevation of the crystal arrangement shown in FIG. 4.

FIGS. 4 and 5 show a crystal arrangement 10 which forms part of a detector in accordance with an embodiment of the present invention. The detector according to the present invention operates by measuring the luminescence of the crystal arrangement using a photodiode or any other suitable intensity sensor. FIG. 4 shows an end-on view of the crystal arrangement 10, whereas FIG. 5 shows a side view of the crystal arrangement 10. The crystal arrangement 10 comprises two similar luminescent uniaxial a-cut crystals 12, 14. The first crystal 12 has an optic axis, the direction of which is indicated by $OA_1$. The second crystal 14 is adjacent the first crystal 12. The second crystal 14 has an optic axis, the direction of which is indicated by $OA_2$, which is perpendicular to the optic axis of the first crystal 12.

Figure 6:
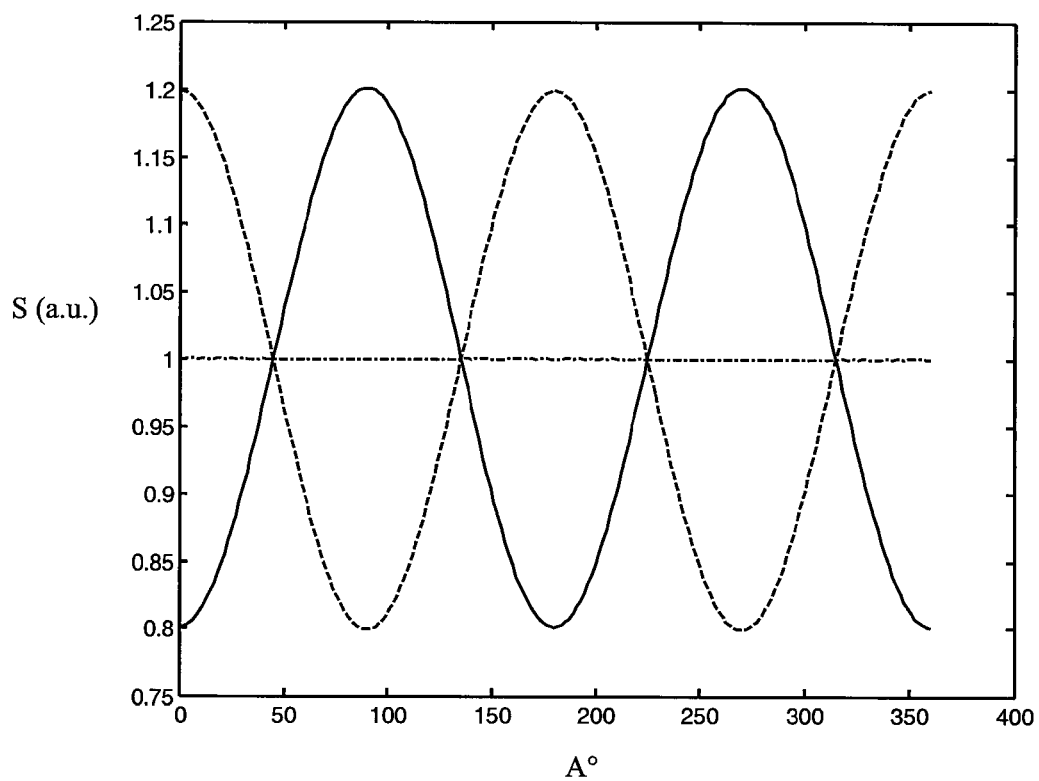
FIG. 6 is a plot showing the response variation of a detector in accordance with an embodiment of the present invention.

FIG. 6 shows detector response variation as a function of angle between the E-field vector of incident radiation and the OA of the first crystal 12, for the first crystal 12 (dashed line), for the second crystal 14 (solid line), and for the sum of both the first crystal 12 and second crystal 14 (dot-dashed line). The angle A is shown on the horizontal axis, and the detector response S is shown on the vertical axis. Because the detector response of the first crystal 12 is out of phase with the detector response of the second crystal 14 by 90 degrees, and because the magnitude of the detector response for both the first and second crystals 12, 14 is equal, the detector response for the sum of both the first crystal 12 and second crystal 14 is invariant with respect to the angle between the E-field vector of incident radiation and the OA of either crystal. In other words, the contribution to response variation due to the first crystal 12 exactly compensates the contribution to response variation due to the second crystal 14, resulting in a stable response over the whole angular range. Although FIG. 6 shows the detector response variation as a function of angle between the E-field vector of incident radiation and the OA of the first crystal 12, the same effect will be observed as a function of angle between the E-field vector of incident radiation and any direction in the plane of the E-field vector.

Because the magnitude of the response of a detector according to an embodiment of the invention is substantially invariant with respect to the E-field vector of the radiation incident on the detector, if the polarization of the radiation incident on the detector is changed then the response of the detector will remain substantially constant. For this reason, any transient response of the detector due to a change in the polarization of the radiation incident on the detector is also substantially eliminated. Furthermore, the response of the detector (due to its invariance with respect to the E-field vector) is also substantially insensitive to any involuntary drift in polarization of the radiation incident on the detector compared to a single a-cut crystal (as is present in the prior art).

The enhanced signal stability of the detector may result in improved imaging by the lithographic apparatus. For example, enhancing the stability of the intensity detector ES (see FIG. 1) may allow the intensity of the radiation beam PB to be controlled more accurately, thereby allowing more accurate control of the critical dimension of patterns projected onto the substrate W.

The use of a detector according to an embodiment of the present invention may provide an advantage compared with a possible alternative approach of using a detector which comprises a single crystal and a polarizing cube. First, a polarizing cube tends to be relatively expensive, especially when designed to be used at a DUV wavelength. Secondly, the use of a polarizing cube results in at least 50% signal loss, and hence the signal to noise ratio of any such signal is reduced. Thirdly, if the polarizing cube and crystal are misaligned, this may result in signal loss which is significantly greater than 50%.

The detector response shown in FIG. 6 is the ideal case, corresponding to equal intensity of the DUV radiation beam in both crystals 12, 14 and exact arrangement of the OA of the first crystal 12 perpendicular to the OA of the second crystal 14. In some embodiments, the detector response may be less ideal. For example, each crystal may absorb some DUV radiation, with the consequence that the intensity in the first and second crystals may be different. Moreover, Fresnel reflection losses may occur at the surface of the first crystal 12 closest to the second crystal 14 and at the surface of the second crystal 14 closest to the first crystal 12.

If the detector is arranged so that the radiation beam propagates through the first crystal 12 and then through the second crystal 14, then the effects described above will result in a lower intensity of the radiation beam within the second crystal 14 of the crystal arrangement 10 (compared to the intensity of the radiation beam within the first crystal 12 of the crystal arrangement 10). If the intensity of the radiation beam within the first crystal 12 is greater than the intensity of the radiation beam in the second crystal 14 (and assuming that the first and second crystals are of equal thickness) then the contribution to the detector response variation due to the second crystal 14 will not exactly compensate the contribution to the detector response variation due to the first crystal 12. This will result in a fluctuating response which is dependent on the E-field vector of the incident radiation.

However, by means of tuning the thickness of the second crystal 14 relative to that of the first crystal 12, these effects can be compensated for. For example, it is possible to increase the thickness of the second crystal 14 (thereby increasing the distance through which incident radiation has to travel through the second crystal 14) so as to increase the detector response variation due to the second crystal 14. The greater the thickness of the second crystal 14, the greater the interaction of the radiation beam with the second crystal 14 as it travels through it, and hence the greater the contribution to the detector response variation due to the second crystal 14. In this way, the thickness of the second crystal 14 can be configured such that its contribution to the detector response variation is increased by an amount equivalent to the decrease which would otherwise be caused by the decrease in the intensity of the radiation beam within the second crystal 14.

The detector response variation is reduced by increasing the contribution to the detector response of the second crystal, by an amount which compensates for the reduction in the intensity of the radiation beam within the second crystal (due to absorption losses in the first crystal and/or Fresnel reflection losses at surfaces of both crystals). Thus, it is possible to make the contribution to the detector response variation of the second crystal compensate for the contribution to the detector response variation of the first crystal, thereby giving a substantially uniform net detector response.

It may be possible to use crystals which have different absorption coefficients to help ensure that the detector response variation of the second crystal compensates for the contribution to the detector response variation of the first crystal. For example, the second crystal could be manufactured with a greater absorption coefficient than the first crystal. In this way, by increasing the absorption coefficient of the second crystal, the second crystal 14 will interact with the radiation beam more strongly than the first crystal 12 for a given distance that the radiation travels through each crystal. For a given thickness of the second crystal 14, the absorption coefficient of the second crystal 14 can be configured such that its contribution to the detector response variation is increased by an amount equivalent to the decrease in its contribution to the detector response variation caused by the decrease in the intensity of the radiation beam within the second crystal 14 compared to the intensity of the radiation beam within the first crystal. One possible way of altering the absorption coefficient of a material is to dope it (or alter its dopant characteristic if the material is already doped). It may also be possible to obtain a second crystal with a greater absorption coefficient than the first crystal, by selecting both the first and second crystals from a single crystal growth process, and choosing the crystals from their relative positions in a crystal rod.

Figure 7:
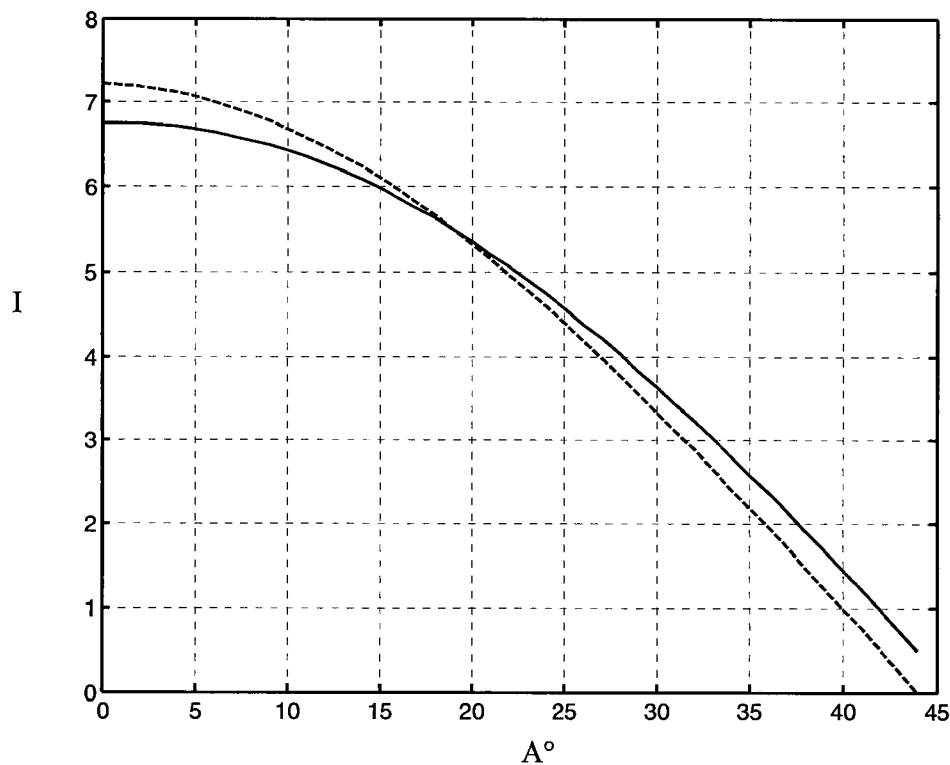
FIG. 7 is a plot showing the relative difference between the intensity of radiation polarized in the x direction and radiation polarized in the y direction for a detector in accordance with an embodiment of the present invention.

A further way in which the performance of a crystal arrangement according to an embodiment of the present invention may be reduced is where the alignment of the first and second crystals 12, 14 is such that their OAs are not exactly perpendicular to one another. FIG. 7 shows the relative difference between the intensity of radiation polarized in the x direction and radiation polarized in the y direction as a function of the angle between the x direction of the incident radiation and the average OA direction of the first and second crystals 12, 14 (i.e. the direction which bisects the OA of the first crystal and the OA of the second crystal). The horizontal axis shows the angle A and the vertical axis shows the relative intensity difference I. The angle between the OA of the first crystal 12 and the OA of the second crystal 14 in the case shown in FIG. 7 is 92 degrees (i.e. the first and second crystals are misaligned by 2 degrees). FIG. 7 shows a case where the first crystal acts like a full wave retarder (solid line) and a case where the first crystal acts like a half wave retarder (dashed line). FIG. 7 shows that when the OA of the crystal is aligned with a polarization state, the intensity difference approaches zero, independent of phase retardation. Assuming a crystal arrangement misalignment accuracy of +/−5 degrees the intensity difference between the different polarizations of radiation may be as low as 1%. It follows that a slight misalignment of the first crystal relative to the second crystal (i.e. less than 5 degrees, or less than 2 degrees) does not significantly adversely affect the response of a detector according to an embodiment of the present invention. Thus, the angle between the OA of the first crystal and the OA of the second crystal may be in the range of about 85° to 95°, may be in the range of about 88° to 92°, and may be 90°. Since there is a degree of tolerance relating to the relative alignment of the first and second crystals, a detector according to an embodiment of the present invention may be easier and cheaper to fabricate than would be the case if there was no tolerance.

In some embodiments, the first and second crystals may be in optical contact. For example the first and second crystals may be touching each other, and may be fixed to one another. In other embodiments, the first and second crystals may not be in optical contact, and may be separated, for example, by a gap. The provision of such a gap may be advantageous as it may improve the stability of the detector. For example, if the first and second crystals are fixed to one another, it is possible that over time they may delaminate. When the crystals are separated by a gap, they are not fixed to one another and therefore they cannot delaminate. Furthermore, if the first and second crystals are separate of one another then the crystals 12, 14 can be rotated independently of one another, thereby allowing adjustment of the relative alignment of their optic axes. For example, one of the crystals may be rotatably mounted and the other may be fixed. Alternatively, both crystals may be rotatably mounted.

The first and second crystals may be separated by a medium which is absorbent of the radiation beam. In this case, it will be appreciated that the characteristics (e.g. thickness and absorption coefficient) of the second crystal can be configured as discussed above so as to compensate its contribution to the variation in the response of the detector due to the decrease in the intensity of the radiation beam in the second crystal relative to the first crystal (as a result of absorption of the radiation beam by the absorbent medium).

Additionally, if the intensity of the radiation beam within the second crystal 14 is diminished as a result of absorption of the radiation beam that occurs between the first crystal 12 and second crystal 14 (say, if the first and second crystals are separated by an absorbing medium) then this diminished intensity of radiation beam within the second crystal 14 can be compensated for in the same manner as described above.

Although in the described embodiments use of the detector has been illustrated in combination with DUV radiation, it will be appreciated that it is within the scope of the invention to use a similar detector in conjunction with any appropriate wavelength of radiation beam of the lithographic apparatus.

It will also be appreciated that the first and second crystals may be made of any appropriate luminescent uniaxial material. An embodiment of the invention is particularly relevant to luminescent uniaxial materials which exhibit transience in their luminescence response due to a change in the polarization of incident radiation they are exposed to.

It will further be appreciated that although in the described lithographic apparatus the detector is used to detect the intensity of the radiation beam, a similar detector may be used to detect another property of the radiation beam.

Although the detector has been described in the context of a lithographic apparatus, it may be used in connection with another type of apparatus.

While specific embodiments of the invention have been described above, it will be appreciated that the invention may be practiced otherwise than as described. The description is not intended to limit the invention.

The invention claimed is:

1. A lithographic apparatus comprising:
a substrate table to hold a substrate;
a projection system to project a patterned radiation beam onto a target portion of the substrate; and
a detector configured to measure a property of the radiation, the detector comprising first and second luminescent uniaxial crystals each having a crystal optic axis, the crystal optic axis of the second uniaxial crystal being arranged such that it is substantially perpendicular to the crystal optic axis of the first uniaxial crystal, wherein the detector does not substantially change the radiation from a polarized state to an unpolarized state, from an unpolarized state to a polarized state or from a particular polarized state to a different polarized state.

2. The lithographic apparatus according to claim 1, wherein the detector is configured to measure the intensity of the radiation.

3. The lithographic apparatus according to claim 1, further comprising an illumination system configured to provide radiation for the patterned radiation beam and configured to change the polarization of the radiation between at least two different polarization states.

4. The lithographic apparatus according to claim 1, wherein the wavelength of the radiation is deep ultraviolet (DUV).

5. The lithographic apparatus according to claim 1, wherein the first and second uniaxial crystals are adjacent one another.

6. The lithographic apparatus according to claim 1, wherein the first and/or second uniaxial crystals comprise sapphire.

7. The lithographic apparatus according to claim 1, wherein the detector is oriented such that the radiation propagates through the first crystal and then through the second crystal, and wherein the second uniaxial crystal is configured to compensate for radiation loss which occurs when the radiation passes through the first uniaxial crystal and/or from the first uniaxial crystal to the second uniaxial crystal.

8. The lithographic apparatus according to claim 7, wherein the second uniaxial crystal is the same material as the first uniaxial crystal, and wherein the second uniaxial crystal is configured such that its thickness in the direction of propagation of the radiation is greater than thickness in the direction of propagation of the radiation of the first uniaxial crystal.

9. The lithographic apparatus according to claim 7, wherein the second uniaxial crystal is configured such that its absorption coefficient is greater than the absorption coefficient of the first uniaxial crystal.

10. The lithographic apparatus according to claim 1, wherein the first and second uniaxial crystals are in optical contact.

11. The lithographic apparatus according to claim 1, wherein the first and second uniaxial crystals are not in optical contact.

12. The lithographic apparatus according to claim 1, wherein the first uniaxial crystal and/or the second uniaxial crystal is rotatably mounted.

13. A device manufacturing method, comprising:
projecting a patterned radiation beam onto a target portion of a substrate; and
using a detector to measure a property of the radiation, the detector comprising first and second luminescent uniaxial crystals each having a crystal optic axis, the crystal optic axis of the second uniaxial crystal being arranged such that it is substantially perpendicular to the crystal optic axis of the first uniaxial crystal, wherein the detector does not substantially change the radiation from a polarized state to an unpolarized state, from an unpolarized state to a polarized state or from a particular polarized state to a different polarized state.

14. The method of claim 13, further comprising changing the polarization of the radiation incident on the detector between at least two different polarization states.

15. The method of claim 13, comprising propagating the radiation through the first uniaxial crystal and then through the second uniaxial crystal, the second uniaxial crystal compensating for radiation loss which occurs when the radiation passes through the first uniaxial crystal and/or from the first uniaxial crystal to the second uniaxial crystal.

16. The method of claim 15, wherein (i) the second uniaxial crystal is the same material as the first uniaxial crystal and the second uniaxial crystal has its thickness in the direction of propagation of the radiation greater than the thickness in the direction of propagation of the radiation of the first uniaxial crystal, or (ii) the second uniaxial crystal has a greater absorption coefficient than that of the first uniaxial crystal, or (iii) both (i) and (ii).

17. A detector configured to measure a property of a beam of radiation, the detector comprising first and second luminescent uniaxial crystals each having a crystal optic axis, the crystal optic axis of the first uniaxial crystal being arranged such that it is substantially perpendicular to the crystal optic axis of the second uniaxial crystal, the first and second uniaxial crystals oriented such that the radiation propagates through the first uniaxial crystal and then through the second uniaxial crystal, and the second uniaxial crystal configured to compensate for radiation loss which occurs when the radiation passes through the first uniaxial crystal and/or from the first uniaxial crystal to the second uniaxial crystal.

18. The detector according to claim 17, wherein the second uniaxial crystal is the same material as the first uniaxial crystal, and the second uniaxial crystal has its thickness in the direction of propagation of the radiation greater than the thickness in the direction of propagation of the radiation of the first uniaxial crystal.

19. The detector according to claim 17, wherein the second uniaxial crystal has a greater absorption coefficient than that of the first uniaxial crystal.

20. The detector according to claim 17, wherein the detector is substantially non-polarizing.

* * * * *